United States Patent [19]
Chang et al.

[11] Patent Number: 5,235,494
[45] Date of Patent: Aug. 10, 1993

[54] ELECTRICAL CONTROLLER HAVING PIVOTALLY MOUNTED CIRCUIT BOARD SUPPORT

[75] Inventors: James S. Chang, Arlington Heights; Russell L. Powers, Willowbrook; Douglas R. Turner, Arlington Heights, all of Ill.

[73] Assignee: The Chamberlain Group, Inc., Elmhurst, Ill.

[21] Appl. No.: 821,227

[22] Filed: Jan. 16, 1992

[51] Int. Cl.⁵ .......................... H05K 7/16; E05D 7/10
[52] U.S. Cl. .............................. 361/736; 174/138 D; 16/262; 361/784; 361/807; 361/825
[58] Field of Search ................. 248/291; 16/225, 257, 16/262, DIG. 13; 361/394, 395, 399, 412, 415, 417, 427, 429; 174/52.1, 138 G, 166 S, 138 D

[56] References Cited

U.S. PATENT DOCUMENTS

| | | | |
|---|---|---|---|
| 3,147,402 | 9/1964 | Hochstetler | 361/412 X |
| 3,382,414 | 5/1968 | Borner | 361/412 |
| 3,420,381 | 1/1969 | Bradfield | 361/429 X |
| 4,034,871 | 7/1977 | Jorgensen | 361/399 X |
| 4,161,017 | 7/1979 | Pierce et al. | 361/412 |
| 4,527,312 | 7/1985 | Ruehl et al. | 361/412 X |
| 4,703,396 | 10/1987 | Fletcher | 361/427 X |
| 4,901,204 | 2/1990 | Hayashi | 361/417 |
| 5,029,044 | 7/1991 | Novak | 361/412 |

Primary Examiner—Leo P. Picard
Assistant Examiner—Michael W. Phillips
Attorney, Agent, or Firm—Fitch, Even, Tabin & Flannery

[57] ABSTRACT

Electrical apparatus including a housing enclosing a printed circuit board mounting a plurality of electrical components. The printed circuit board is detachably mounted on a pivotal support which permits rotation of the circuit board between various positions in the access opening to the housing. The support is a one piece plastic member which frictionally receives the printed circuit board in an elongated slot.

8 Claims, 2 Drawing Sheets

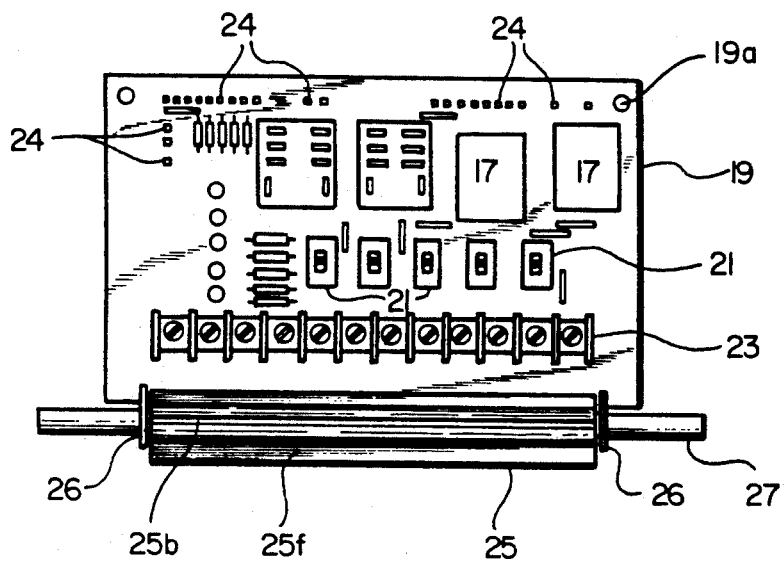
FIG.4
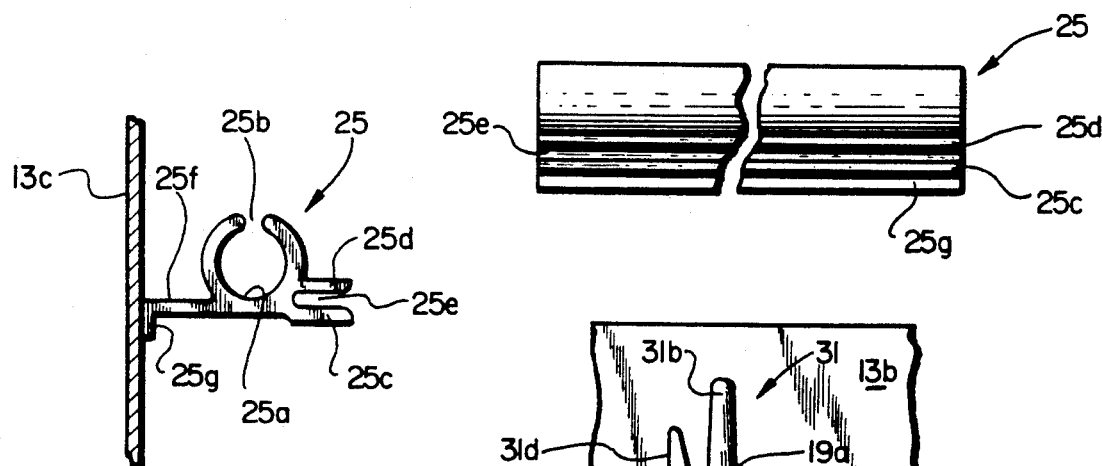
FIG.5
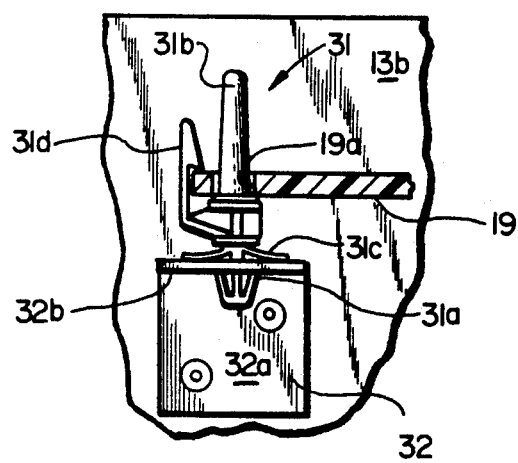
FIG.6
FIG.7

ELECTRICAL CONTROLLER HAVING PIVOTALLY MOUNTED CIRCUIT BOARD SUPPORT

BACKGROUND OF THE INVENTION

The present invention relates generally to supports for printed circuit boards and more specifically to means for movably mounting printed circuit boards in the housing of an electrical controller.

In present electrical and electronic apparatus, it is common to support some or all of the electric circuit components on electrical printed circuit boards. The use of such boards simplifies manufacture and repair of the products involved and results in fewer manufacturing defects as a consequence of fewer circuit connections to be made. While circuit boards may take many forms, they typically comprise a flat member of insulating material which has deposited thereon a plurality of conducting paths providing the circuit connections for the circuit components mounted on the board. The connections between the circuit board and other components of the apparatus may consist of contact connections made automatically with the mounting on the board, or by soldered or other hard wire connections.

It is common for such circuit boards to be mounted in such a way that they are easily removed for repair or for replacement. It is also known to mount circuit boards for pivotal movement to provide access to the boards or access to components behind the boards.

Examples of prior art disclosing such pivotal mounting of circuit boards are the U.S. Patents to Huerre U.S. Pat. No. 4,958,261, Hayashi U.S. Pat. No. 4,901,204 and Drexler U.S. Pat. No. 4,470,101. There are other prior art patents which disclose means for pivotally mounting circuit boards so that they are readily detachable. Examples of such hinged, detachable circuit board patents are Pierce et al. U.S. Pat. No. 4,058,890 and Pierce et al. U.S. Pat. No. 4,161,017. The patent to Bradfield U.S. Pat. No. 3,420,381 discloses hinged racks for supporting electrical components.

A review of the above cited patents reveals that the prior art structures for pivotally and detachably mounting printed circuit boards are complex structurally and primarily suitable for circuit boards which are lightweight and not supporting substantial discrete electrical components. The various prior art patents showing mounting structures for a plurality of closely spaced circuit boards are used primarily for electronic circuit elements and may be unsuited for use in applications in which the circuit boards mount heavy bulky components such as relays, transformers, and large discrete circuit elements.

There are many applications of circuit boards to controls for electromechanical devices such as garage door openers, air conditioners, furnaces, etc., where sophisticated electronic circuity is integrated with switches, relays, valves, circuit breakers and the like. Since many of these electromechanical devices such as switches, relays and circuit breakers are more subject to malfunctions and breakdowns than purely electronic components, it is important that the layout of the parts and components be such as to afford easy access for service purposes.

Thus, while circuit boards provide a means of reducing assembly costs and defects in the finished products, it is important that such circuit boards be integrated with products in such a way that added service problems are not created. Accordingly, it is desirable to orient circuit boards within their respective mounting enclosures so that they are (1) easily accessible, (2) readily removable for repair and replacement and (3) not obstructing access to other circuit components within the enclosure that may require service. In order to satisfy these objectives, it may be necessary to mount the circuit boards for easy pivotal movement out of an obstructing position and for easy disassembly for repair and replacement of the circuit board or the elements carried thereon.

SUMMARY OF THE INVENTION

The present invention relates to electrical apparatus having a housing enclosing a printed circuit board which is detachably mounted in a support for pivotal movement with respect to the housing. The circuit board support includes an extruded, elongated plastic member having a lengthwise extending cylindrical passageway which receives a shaft for journaling the plastic member with respect to the housing. A lengthwise extending channel or slot in the plastic member is formed with spaced sidewalls that are adapted to receive and grip an edge of the printed circuit board. The spacing of the sidewalls is such that the circuit board is firmly retained in the channel under normal use conditions, but is subject to ready removal by the application of a manual force on the circuit board in a direction outwardly of the channel.

The circuit board is mounted in an opening in a box-like housing in a first position in which the components on the circuit board are easily accessible through the housing opening. Latch means operative between the circuit board and the housing retains the board in the first position. The shaft for mounting the plastic support is received in aligned openings in parallel opposed walls of the housing. The housing encloses a plurality of other electrical components which are connected in circuit with the board and the components mounted thereon. In order to provide access to this plurality of other electrical components, the circuit board may be pivoted through an angle of about 90° after first disengaging the latch means. By pivoting the circuit board upwardly so that it extends out through the housing opening, the circuit board no longer obstructs access to the components located within the housing and initially beneath the circuit board.

The plastic member is formed with a slot extending the length of the shaft receiving passageway. The resilience of the plastic material permits the cylindrical passageway to be designed slightly undersized with respect to the shaft to be received therein to assure that the plastic support member will be snugly received on the supporting shaft.

The plastic circuit board support provides an inexpensive and simple means for mounting a circuit board for pivotal movement to provide access to other components in the housing and means for detachably supporting the circuit board so that it may be easily removed for repair, testing or replacement.

Accordingly, it is an object of the present invention to provide an improved circuit board support which permits pivotal movement and easy detachment and removal of the circuit board with respect to a housing enclosure.

It is a further object of the present invention to provide an improved circuit board mounting wherein the board is pivotally mounted in a housing opening by a simple hinge member and is movable by actuation of a simple manual latch from a first position in which the components mounted on the circuit board are accessible to a second position in which other components in the housing are accessible.

It is another object of the present invention to provide an improved circuit board support including a unitary plastic member having a slot for detachably receiving a circuit board edge and a passageway receiving a shaft for mounting the member and board for rotary movement.

BRIEF DESCRIPTION OF THE DRAWINGS

These and other objects and advantages of the invention will become apparent from the following detailed description taken in conjunction with the accompanying drawings in which:

FIG. 4 is a top plan view of the circuit board and its support;

FIG. 5 is a front elevational view of the plastic circuit board support;

FIG. 6 is a side or end view of the plastic circuit board support of FIG. 5; and FIG. 7 is an enlarged, fragmentary sectional view taken on line 7—7 of FIG. 2 with the circuit board shown in the lowered, latched position.

DETAILED DESCRIPTION OF PREFERRED EMBODIMENT

Figure 1:
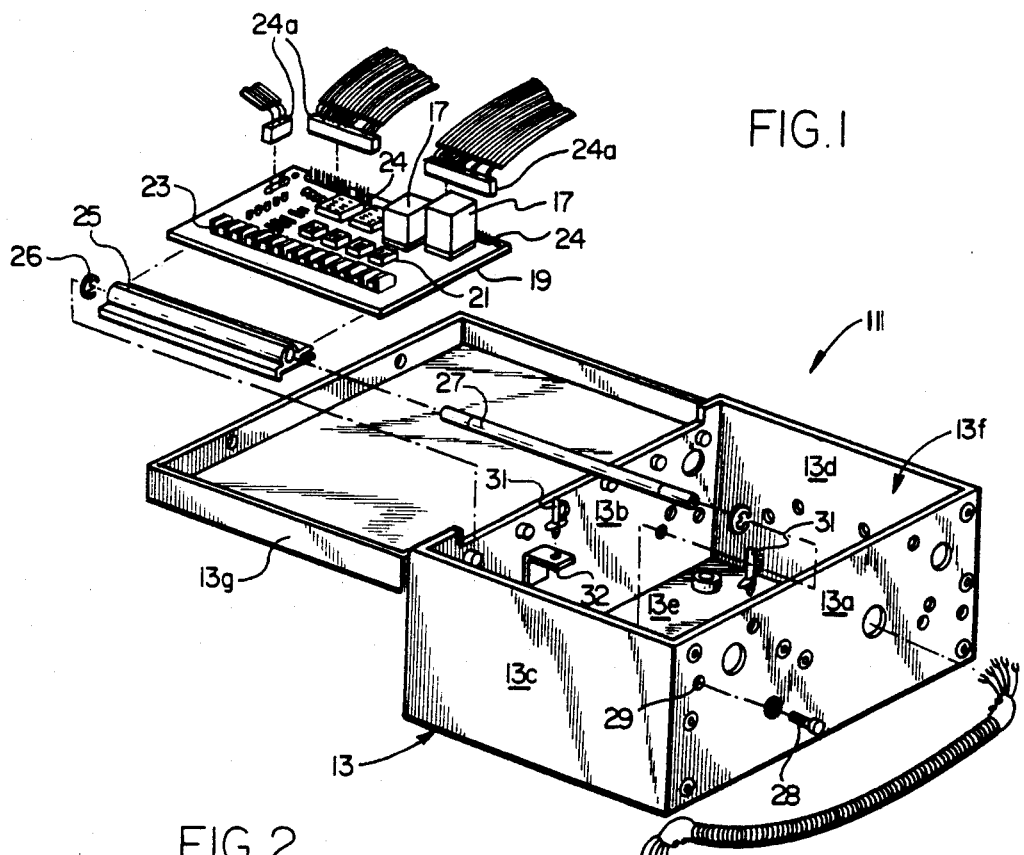
FIG. 1 is an exploded perspective view of an electrical controller including the circuit board support of the present invention.
Figure 2:
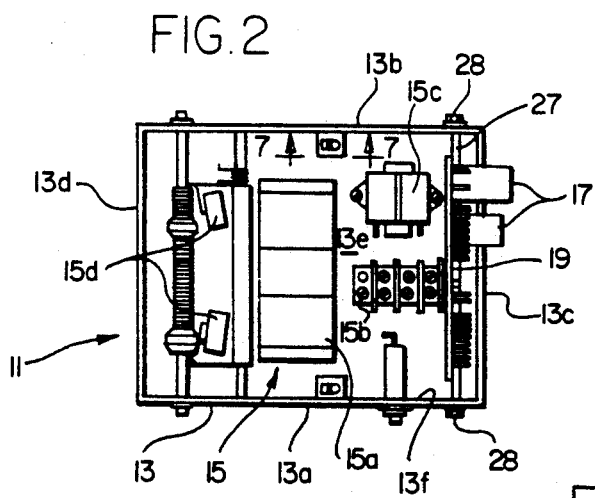
FIG. 2 is a top plan view of the electrical controller of FIG. 1 with the circuit board pivoted outwardly.
Figure 3:
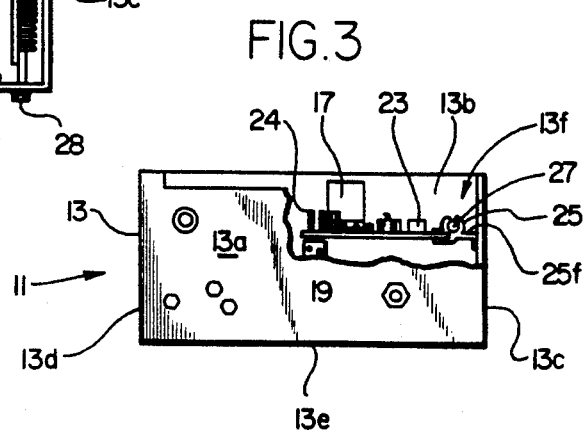
FIG. 3 is a side elevational view of the electrical controller of FIG. 2 with the circuit board pivoted downwardly.

Referring to FIGS. 1 to 3 of the drawings, there is shown an electrical controller designated generally by reference numeral 11. The controller 11 may take the form of a control for a garage door opener or it may be any type of electrical or electronic device having a housing in which printed circuit boards and electrical components are disposed. The invention applies broadly to the mounting of printed circuit boards in a manner to permit easy testing, repair and replacement of the circuit boards and the other associated circuit components housed or enclosed with the circuit board.

The electrical controller 11 embodying the present invention includes a housing 13 being formed by two pairs of opposed sidewalls 13a, 13b and 13c, 13d, and a bottom wall 13e. The housing 13 is formed with an opening 13f which is opposite the bottom wall 13e. The opening 13f is closed by a removable wall or cover 13g which is secured in place closing the housing 13 by easily removable screws or the like. The wall 13g is made removable so that access may be had to the interior of the housing 13 to service or inspect the components in the housing 13.

In a typical controller there may be various types of electrical and electronic components including switches, circuit breakers, relays, transformers and discrete electrical components such as resistors and capacitors connected in circuit with electronic components including integrated circuit chips and the like. In the housing 13, there are mounted a plurality of electrical components 15 secured to the bottom wall 13e. The components 15 include circuit breakers 15a, connector block 15b, transformer 15c and limit switches 15d.

In order to minimize production assembly costs, additional components including relays 17 are mounted on a circuit board 19 which has conductors deposited or otherwise applied to the insulating board to interconnect the various components mounted thereon. The circuit board 19 also supports a plurality of manually operable switches 21 which may be selectively adjusted to obtain a desired operating mode from the controller 11. To connect the circuit board and its components to the other circuit elements within the housing 13, there are provided a plurality of connectors 23 which include screws to secure wire connectors to the conductors on the circuit board 19. The connectors 23 simplify the connecting of the circuit board into the controller 11 without any solder connections, making it easy to remove and replace the circuit board 19. The screw type connectors 23 could be replaced by the well known plug connectors used to effect easy detachable connection of multiple leads to a circuit board. Pins 24 are mounted on the circuit board 19 on the edge opposite from the edge along which the screw type connectors 23 are disposed. The pins 24 are positioned to be engaged by one or more multiple conductor female connectors 24a as an alternative to the screw connectors, to interconnect in circuit the various components on the board 19 and within the housing 13.

In the position shown in FIG. 3, the circuit board 19 occupies much of the opening 13f and limits access to components, such as the transformer 15c, the circuit breakers 15a and connector blocks 15b, located within the housing 13. The printed circuit board 19 has been positioned in the opening 13f, however, to provide good access to the components on the circuit board as well as to provide easy access to remove and replace the board itself. In order to eliminate the problem of the circuit board 19 obstructing the opening 13f, the board 19 is mounted on a pivotal plastic support member 25 which is journaled on a shaft 27. The shaft 27 is received in aligned openings 29 formed in the opposed sidewalls 13a and 13b. The shaft 27 is formed with annular grooves which receive C-rings 26 adjacent the inner surface of sidewalls 13a and 13b to limit axial movement of hinge member 25 with respect to shaft 27. The ends of the shaft 27 have threaded openings to receive screws 28 for securing washers to the ends of the shaft 27. These washers engage the outer surface of walls 13a and 13b to retain the shaft 27 assembled to the housing 13.

The support or hinge member 25 is preferably formed of an extruded, rigid PVC plastic having a central cylindrical passageway 25a in which the shaft 27 is received. In order to assure that the support member 25 has a snug fit on the shaft 27, the passageway 25a is extruded to a dimension equal to or less than the diameter of shaft 27. The wall defining the passageway 25a is slotted at 25b so that, in the case of an undersized flexed outwardly to permit the shaft 27 to fit into the passageway 25a. Thus, the slot 25b allows the support member 25 to be made without tight tolerances and still assures a snug fit on the shaft 27.

For the purpose of detachably supporting the circuit board 19, the support member 25 is formed with a pair of substantially parallel spaced walls 25c and 25d, as best shown in FIG. 6. The walls 25c and 25d extend the entire length of the support member 25 and form between them an outwardly facing channel 25e which is dimensioned to provide an interference fit at the edge of the circuit board 19 so that the circuit board is firmly retained therein. To provide a good gripping engagement between the circuit board 19 and the walls 25c and 25d, the walls are angled together going from the bottom of the channel 25e to the outer end or mouth. As a consequence, there is little or no interference between the walls 25c and 25d, and the circuit board 19 at the edge entering deepest into the channel 25e while the outer edges of the walls 25c and 25d have an interference of on the order of 0.0025 to 0.0125 inches. The flexure of the walls 25c and 25d from their unstressed positions to accommodate the circuit board with this interference results in a retaining force being exerted by the walls 25c and 25d against the circuit board 19.

In spite of this gripping force exerted by the walls 25c and 25d, it has been found that the circuit board 19 may be manually removed from the support member 25 when desired. At the same time, the circuit board 19 will remain assembled to the support member 25 under normal conditions of use, including the pivotal movement of the board 19 with respect to the housing 13.

Several means are provided to retain the circuit board in position shown in FIG. 3, rather than allowing it to fall by gravity downwardly where it might short out some of the components mounted within the housing 13. The support member 25 is formed with wall 25f which is generally coplanar with the channel 25e but extending outwardly in the opposite direction to engage the wall 13c, as shown best in FIG. 6. The wall 25f extends the length of the support member 25, having a downwardly extending lip 25g. As is evident from FIG. 6, the wall 25f and the lip 25g engage wall 13c and thus limit the clockwise rotation of the support member 25 and the circuit board 19 with respect to the axis of the shaft 27.

A second stop comprising latches 31 is provided to limit the rotation or pivotal movement in either direction from the position shown in FIG. 3. Each latch 31 is secured to one of the sidewalls 13a or 13b of the housing 13, by means of an L-shaped bracket 32 having a first leg 32a secured to the sidewall and a second horizontal leg 32b which supports latch 31. As is best shown in FIG. 7, each latch 31 includes a support portion 31a which retains the latch in assembled position on the bracket 32. Each latch 31 also includes a locating projection 31b, base portion 31c and a catch member 31d. The projection 31b extends through an opening 19a in the circuit board 19, and enables the latch 31 to secure the circuit board against horizontal displacement as in connection with disengagement from the support 25. The catch member 31d is flexible so that it deflects to the left as shown in FIG. 7 when the circuit board 19 is moved downwardly onto the latch 31. Once the circuit board is in its horizontal position, the catch member 31d moves to the right to be in locking engagement with the edge of the circuit board. When it is desired to rotate the circuit board 19 upwardly, the two catch members 31d on the latches 31 are deflected with finger pressure to allow upward movement of the circuit board 19. The base portion 31c of the latch 31 engages the upper surface of the bracket leg 32b and holds the latch in its upright position. Thus the latches 31 retain the circuit board 19 against rotary movement until the catch members 31d are manually deflected to allow the circuit board 19 to move out of its position in which it is secured by the latches 31.

It is further noted that the pin 31b retains the circuit board against movement away from the support member 25. Thus, each pin 31b prevents the board from being detached from its hinge support while it is in the latched position. The latches 31 consequently eliminate any possibility of the circuit board 19 being dislodged from the groove 25e as a result of an impact or blow against the housing 13.

The location of the latches 31 is such that they may be operated by finger pressure at the same time a lifting force is applied to rotate the circuit board to its non-obstructing position or to the position for removal from the support member. Whether the connectors to the circuit board 19 are the plug type or the screw operated type connectors 23 as shown in FIG. 1, the board 19 is so accessible in the opening 13f that it is very simple for a serviceman to disconnect the circuit wiring to the circuit board and detach the board from the support member 25 in order to test, repair or replace the board or any elements thereon. If a service problem relates to components other than those on the circuit board 19, it is easy to rotate the circuit board 90° to the upright position as shown in FIG. 2, giving full access through opening 13f to the components mounted in the bottom of the housing 13.

The circuit board support member 25 with its mounting shaft 27 provides a simple and inexpensive means for improving the layout and accessibility of the electrical components in a controller housing. The detachability of the circuit board 19 from the support member 25 by merely overcoming the frictional engagement between the circuit board edge and the channel 25e allows a serviceman to remove the board quickly without tools. This aspect is important, since such controllers are often positioned in elevated or cramped locations where the serviceman may not have easy access.

Although the housing 13 is described as having an upwardly facing opening 13f, it should be understood that in instances where the controller 11 is mounted overhead, the opening 13f would be facing downwardly to facilitate access to the housing. In the case of a garage door opener, the controller would normally be mounted in such an overhead location with the access opening facing downwardly.

Although the invention has been described in regard to a preferred embodiment, it should be understood that various changes and modifications as would be obvious to one having the ordinary skill in this art may be made without departing from the scope of the invention which is defined in the appended claims.

What is claimed is:

1. An electrical controller comprising:
   a component housing having sidewalls, a bottom wall and an opening opposite to said bottom wall,
   a plurality of electrical components mounted within said housing,
   a circuit board mounted within said housing and supporting additional components which are interconnected to said plurality of electrical components, and
   a hinge detachably mounting said circuit board in said housing at least partially blocking said opening, said hinge including a shaft and a hinge member journaled on said shaft, said hinge member being formed with an elongated channel, said elongated channel receiving an edge of said circuit board and being in frictional engagement with said circuit board at opposite sides of said circuit board said circuit board being removably retained as a consequence of the frictional engagement.

2. An electrical controller in accordance with claim 1 wherein said hinge member is an elongated one-piece plastic part having a lengthwise extending passageway receiving said shaft, said channel extending parallel to said passageway.

3. An electrical controller comprising:
a component housing having sidewalls, a bottom wall and an opening opposite to said bottom wall,
a plurality of electrical components mounted within said housing,
a circuit board mounted within said housing and supporting additional components which are interconnected to said plurality of electrical components, and
a hinge for detachably mounting said circuit board in said housing at least partially blocking said opening, said hinge including a shaft and a hinge member journaled on said shaft, said shaft being supported in opposed sidewalls of said housing, said hinge member being formed with an elongated channel which receives and is in frictional engagement with an edge of said circuit board and frictionally retains such circuit board as a consequence of the frictional engagement, said circuit board being pivotally supported by said hinge for movement between a first position extending across said opening to a second position generally perpendicular to said first position to provide access to said plurality of components which are mounted on said bottom wall beneath said circuit board in said first position.

4. An electrical controller in accordance with claim 3 wherein said shaft includes a pair of annular grooves spaced apart a distance substantially equal to the length of said hinge member and being spaced inwardly from the ends of said shaft, resilient C-rings received in said annular grooves to position said hinge member centrally on said shaft, and assembly means secured to the ends of said shaft for engagement with the outside of said opposed sidewalls to prevent disengagement of said shaft from said housing.

5. An electrical controller in accordance with claim 3 wherein electrical connectors are provided between said circuit board and said plurality of components in said housing, said connectors being readily detachable to permit disconnection and removal of said circuit board and said additional components from said controller.

6. An electrical controller in accordance with claim 3 including latch means operating between said circuit board and said component housing to releasably retain said circuit board in said first position.

7. An electrical controller in accordance with claim 6 wherein said latch means includes means for restraining said circuit board from movement detaching said circuit board from said hinge member.

8. An electrical controller in accordance with claim 7 wherein said latch means includes a stop to restrain movement of said circuit board in one direction about said shaft and a releasable latch to selectively prevent movement in the other direction about said shaft, said latch means including a pin extending from said stop through an opening in said circuit board to restrain said circuit board from movement radially of said shaft.

* * * * *

UNITED STATES PATENT AND TRADEMARK OFFICE
CERTIFICATE OF CORRECTION

PATENT NO. : 5,235,494
DATED : August 10, 1993
INVENTOR(S) : James S. Chang et al.

It is certified that error appears in the above-indentified patent and that said Letters Patent is hereby corrected as shown below:

At column 4, line 58, after "undersized" insert --passageway, the plastic walls adjacent the slot 25b are--.

At column 5, line 11, change "inches" to --inch--.

At column 7, line 17, after "hinge" delete "for".

Signed and Sealed this

Twenty-sixth Day of April, 1994

Attest:

BRUCE LEHMAN

*Attesting Officer*  *Commissioner of Patents and Trademarks*